US010903273B2

(12) United States Patent
Cheng

(10) Patent No.: US 10,903,273 B2
(45) Date of Patent: Jan. 26, 2021

(54) PHASE CHANGE MEMORY WITH GRADUAL CONDUCTANCE CHANGE

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 16/240,233

(22) Filed: Jan. 4, 2019

(65) Prior Publication Data
US 2020/0219933 A1     Jul. 9, 2020

(51) Int. Cl.
*H01L 27/24* (2006.01)
*H01L 45/00* (2006.01)

(52) U.S. Cl.
CPC .......... *H01L 27/2463* (2013.01); *H01L 45/06* (2013.01); *H01L 45/1233* (2013.01); *H01L 45/1253* (2013.01); *H01L 45/143* (2013.01); *H01L 45/144* (2013.01); *H01L 45/1691* (2013.01)

(58) Field of Classification Search
None
See application file for complete search history.

(56) References Cited

U.S. PATENT DOCUMENTS

| | | | |
|---|---|---|---|
| 6,416,837 B1 * | 7/2002 | Kojima | G11B 7/00454 428/64.1 |
| 7,613,029 B2 | 11/2009 | Kim et al. | |
| 7,751,217 B2 | 7/2010 | Lam et al. | |
| 7,928,423 B2 | 4/2011 | Shim et al. | |
| 9,761,796 B2 | 9/2017 | Ohba et al. | |
| 2010/0046285 A1 * | 2/2010 | Lung | H01L 45/148 365/163 |
| 2017/0017879 A1 | 1/2017 | Kataeva et al. | |

FOREIGN PATENT DOCUMENTS

EP     1724850 A2     11/2006

OTHER PUBLICATIONS

Wang et al., "Recent Advances on Neuromorphic Systems Using Phase-Change Materials", Nanoscale Research Letters, Published: May 11, 2017, 22 pages, 12:347.

Ielmini, D., et al., "Parasitic Reset in the Programming Transient of PCMs", IEEE Electron Device Letters, Nov. 2005, pp. 799-801, vol. 26, No. 11.

Hatayama, S., et al., "Inverse Resistance Change Cr2Ge2Te6!Based PCRAM Enabling Ultralow-Energy Amorphization", ACS Appl. Mater. Interfaces, Published: Dec. 27, 2017, pp. 2725-2734, 10.

* cited by examiner

*Primary Examiner* — Jay C Chang
(74) *Attorney, Agent, or Firm* — Scully, Scott, Murphy & Presser, P.C.; L. Jeffrey Kelly, Esq.

(57) ABSTRACT

A phase change memory cell is provided that includes a phase change material-containing structure sandwiched between first and second electrodes. The phase change material-containing structure has an electrical conductance that changes gradually and thus may be used in analog or neuromorphic computing. The phase change material-containing structure includes two phase change material pillars that are composed of different phase change materials that exhibit an opposite change of electrical resistance (or inversely electrical conductance) during a SET operation and a RESET operation.

11 Claims, 6 Drawing Sheets

(Invention)

(Invention)

PHASE CHANGE MEMORY WITH GRADUAL CONDUCTANCE CHANGE

BACKGROUND

The present application relates to a memory structure and a method of forming the same. More particularly, the present application relates to a phase change memory (PCM) cell that includes two phase change material pillars that are composed of different phase change materials that undergo an opposite change of electrical resistance (or inversely electrical conductance) during a SET operation and a RESET operation.

Phase change memory (PCM) cell is a type of non-volatile random access memory (NVRAM). A NVRAM retains its information when the power is turned off. This is in contrast to dynamic random access memory (DRAM) and static random access memory (SRAM), which both maintain data only for as long as power is applied.

A typically PCM cell includes a material stack of, and from bottom to top, a bottom electrode, a phase change memory material that exhibits a change in atomic order (from crystalline to amorphous or vice versa), and a top electrode. In such PCM cells, the electrical conductance changes abruptly during the change in atomic order. For some applications such as, for example, analog computing or neuromorphic applications, it is desired to have the electrical conductance of a PCM cell changing gradually (or at least multiple bits) instead of abruptly.

SUMMARY

A phase change memory cell is provided that includes a phase change material-containing structure sandwiched between first and second electrodes. The phase change material-containing structure has an electrical conductance that changes gradually and thus may be used in analog or neuromorphic computing. The phase change material-containing structure includes two phase change material pillars that are composed of different phase change materials that exhibit an opposite change of electrical resistance (or inversely electrical conductance) during a SET operation and a RESET operation. Notably, one of the phase change materials exhibits an electrical resistance increase (or an electrical conductance decrease) during the RESET operation and an electrical resistance decrease (or an electrical conductance increase) during the SET operation, while the other phase change material exhibits an electrical resistance decrease (or an electrical conductance increase) during the RESET operation and an electrical resistance increase (or an electrical conductance decrease) during the SET operation. During the SET operation, the phase change materials change from an amorphous state to a crystalline state, and during the RESET operation the phase change materials change from a crystalline state to an amorphous state.

In one aspect of the present application, a memory structure is provided that has a gradual electrical conductance change. In one embodiment, the memory structure of the present application includes a first electrode located on a surface of a semiconductor substrate. The memory cell further includes a phase change material-containing structure exhibiting a gradual conductance change located on the first electrode. In accordance with the present application, the phase change material-containing structure includes a first phase change material pillar composed of a first phase change material that exhibits a first electrical conductance change during a SET operation and a RESET operation laterally adjacent to a second phase change material pillar composed of a second phase change material that exhibits a second electrical conductance change, which is opposite the first electrical conductance change, during the SET operation and the RESET operation. A second electrode is located on a surface of the phase change material-containing structure.

In another aspect of the present application, a method of forming a memory structure that has a gradual conductance change is provided. In one embodiment, the method includes forming a first electrode on a surface of a semiconductor substrate. Next, a phase change material-containing structure is provided on the first electrode. In accordance with the present application, the phase change material-containing structure includes a first phase change material pillar composed of a first phase change material exhibiting a first electrical conductance change during a SET operation and a RESET operation laterally adjacent to a second phase change material pillar composed of a second phase change material exhibiting a second electrical conductance change, which is opposite the first electrical conductance change, during the SET operation and the RESET operation. A second electrode is formed on a surface of the phase change material-containing structure.

DETAILED DESCRIPTION

Figure 1:
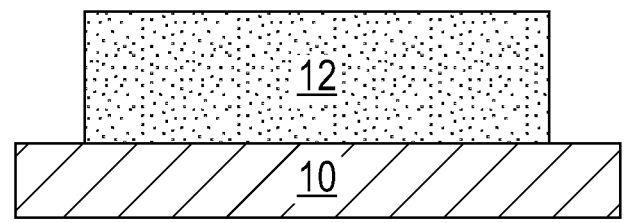
FIG. 1 is a cross sectional view of an exemplary memory structure of the present application and during an early stage of fabrication, the exemplary memory structure including a first electrode located on a surface of a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary memory structure in accordance with the present application and during an early stage of fabrication, wherein the exemplary memory structure includes a first electrode 12 located on a surface of a semiconductor substrate 10.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 may be a bulk semiconductor substrate. The term "bulk semiconductor substrate" denotes a substrate that is composed entirely of one or more semiconductor materials. In one example, the bulk semiconductor substrate is composed entirely of Si.

In some embodiments, the semiconductor substrate 10 is composed of a semiconductor-on-insulator substrate (SOI). A SOI substrate typically includes a handle substrate, an insulator layer and a topmost semiconductor material layer. In some embodiments, the handle substrate of the SOI may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above.

Although not shown, the semiconductor substrate 10 may be processed to include one or more semiconductor devices such as, for example, transistors, capacitors, diodes, resistors, conductive wires, and the like. The semiconductor substrate 10 may also include one or more isolation structures such as, for example, a trench isolation structure, formed therein.

As is illustrated in FIG. 1, first electrode 12 is formed on a surface of the semiconductor substrate 10. The first electrode 12 (or bottom electrode) includes a conductive metal and/or a conductive metal nitride. Examples of conductive materials that can be used as the first electrode 12 include, but are not limited to, titanium nitride (TiN), tantalum nitride (TaN), ruthenium (Ru), copper (Cu)), tungsten (W), tungsten nitride (WN), silver (Ag), platinum (Pt), palladium (Pd), or aluminum (Al). The first electrode 12 may include a single layered structure composed entirely of one conductive material or a multilayered structure containing at least two different conductive materials stacked one atop the other.

The first electrode 12 may by formed by first depositing a layer of the conductive metal and/or conductive metal nitride, and thereafter patterning the deposited layer of the conductive metal and/or conductive metal nitride. The depositing of the layer of the conductive metal and/or conductive metal nitride may include chemical vapor deposition (CVD), plasma enhanced chemical vapor deposition (PECVD), atomic layer deposition (ALD), sputtering or plating. The layer of the conductive metal and/or conductive metal nitride (and thus the first electrode 12) typically has a thickness from 10 nm to 200 nm. In one embodiment, the patterning of the layer of the conductive metal and/or conductive metal nitride may be performed by lithography and etching. Alternatively, any other well known patterning process may be used to provide the first electrode 12. After patterning, the first electrode 12 may have any desired width and/or length. In some embodiments, the first electrode 12, when viewed from a top down view, is circular in shape. Other shapes, such as, for example, square, rectangular, etc., are possible and can be employed in the present application.

In some embodiments, a selector (not shown) can be formed on the first electrode 12. When present, the selector includes transistors, diodes, threshold switching devices, etc. The selector can be formed utilizing any suitable process that is well known to those skilled in the art.

Figure 2:
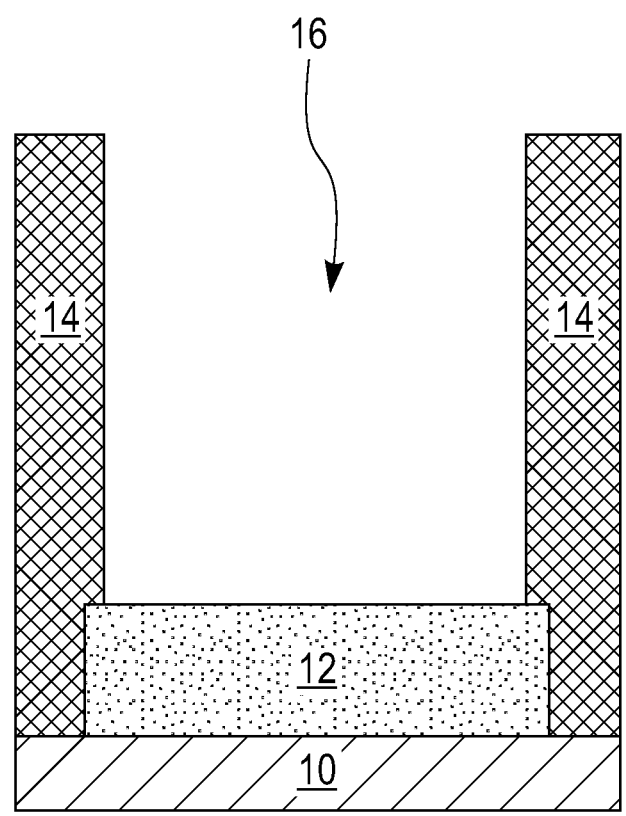
FIG. 2 is a cross sectional view of the exemplary memory structure of FIG. 1 after forming an interlevel dielectric (ILD) material layer having an opening that physically exposes a surface of the first electrode.

Referring now to FIG. 2, there is illustrated the exemplary semiconductor structure of FIG. 1 after forming an interlevel dielectric (ILD) material layer 14 having an opening 16 that physically exposes a surface of the first electrode 12. The ILD material layer 14 is formed upon the entirety of the first electrode 12 and across the entirety of the semiconductor substrate 10.

The ILD material layer 14 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In one embodiment, the ILD material layer 14 can be formed utilizing a deposition process including, for example, CVD, PECVD, evaporation or spin-on coating. The thickness of the ILD material layer 14 may vary. A typically thickness from the ILD material layer 14 is from 50 nm to 250 nm. Although not shown, the ILD material layer 14 may comprise a multi-layered structure that includes at least two different dielectric materials stacked one atop the other such as, for example, silicon nitride and silicon dioxide.

After forming the ILD material layer 14, opening 16 is formed into the ILD material layer 14 by lithography and etching. The opening 16 physically exposes a portion of the first electrode 12. In some embodiments and as illustrated, the opening 16 does not physically expose an entirety of the first electrode 12. In such embodiments, the sidewall of the opening 16 lands on a topmost surface of the first electrode 12. In some embodiments (not shown), the opening 16 physically exposes an entirety of the first electrode 12 such that the sidewall of the opening 16 is vertically aligned with the sidewall of the first electrode 12. The opening 16 is typically circular in shape. Other shapes (such as square, rectangular, etc.) are also conceived and can be employed in the present application.

Figure 3:
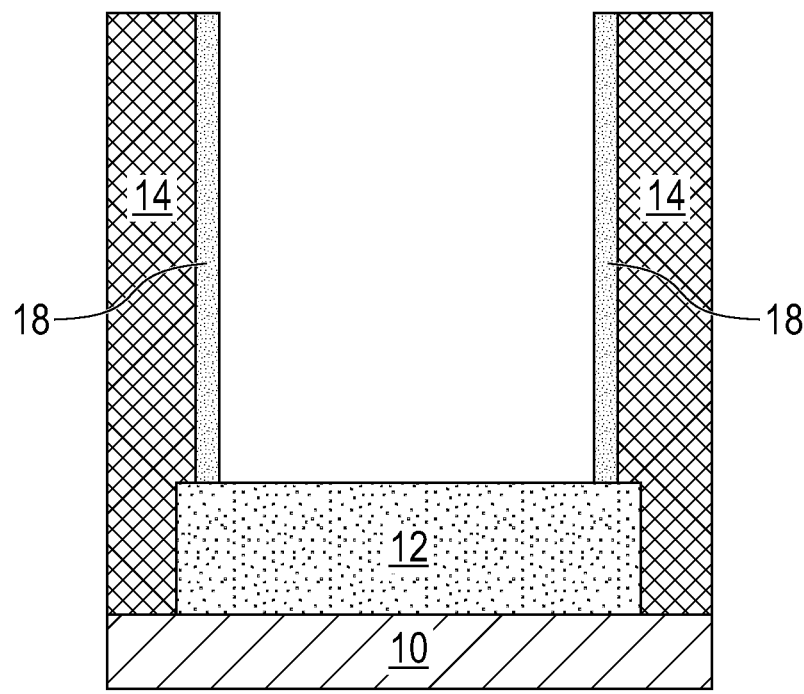
FIG. 3 is a cross sectional view of the exemplary memory structure of FIG. 2 after forming a first dielectric spacer within the opening and along an inner sidewall of the ILD material layer.

Referring now to FIG. 3, there is illustrated the exemplary semiconductor structure of FIG. 2 after forming a first dielectric spacer 18 within the opening 16 and along an inner sidewall of the ILD material layer 14. In some embodiments, the formation of the first dielectric spacer 18 may be omitted. The first dielectric spacer 18 is composed of a spacer dielectric material that has a different dielectric material composition than the ILD material layer 14. Some examples of the spacer dielectric material that can be employed in the present application include, but are not limited to, silicon nitride (SiN), silicon carbide (SiC), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxynitride (SiON), and combinations thereof. The dielectric spacer material may have a dielectric constant of less than about 7, or even less than about 5; all dielectric constants referred to herein are relative to a vacuum unless otherwise stated. First dielectric spacer 18 can be formed by any suitable technique such as, for example, deposition followed by a directional etch. Deposition may include, but is not limited to, ALD or CVD. The directional etch may include, but is not limited to, reactive ion etching (RIE).

When present, and in some embodiments, the first dielectric spacer 18 may have a topmost surface that is coplanar with a topmost surface of the ILD material layer 14. As is shown, the first dielectric spacer 18 has an outermost sidewall that is in direct physical contact with the physically exposed sidewall of the ILD material layer 14 that is provided by opening 16. The first dielectric spacer 18 has a bottommost surface that directly contacts a portion of a topmost surface of the first electrode 12. The first dielectric spacer 18 may have a width, as measured from a first outermost sidewall to a second outermost sidewall, opposite the first outermost sidewall, from 2 nm to 10 nm. The width may also be referred to as a lateral thickness.

Figure 4:
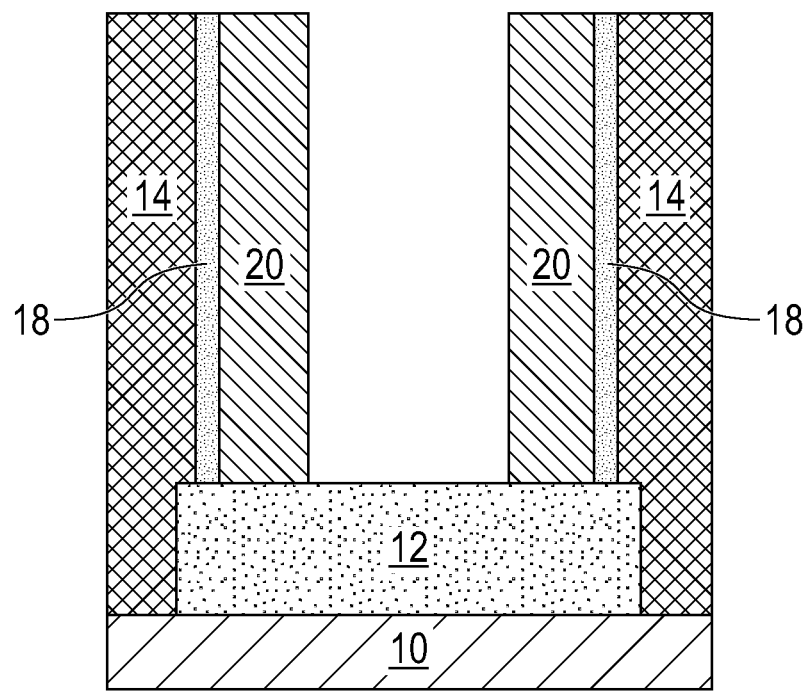
FIG. 4 is a cross sectional view of the exemplary memory structure of FIG. 3 after forming a first phase change memory spacer composed of a first phase change material that exhibits a first electrical conductance change during a SET operation and a RESET operation within the opening and along a sidewall of the first dielectric spacer.

Referring now to FIG. 4, there is illustrated the exemplary semiconductor structure of FIG. 3 after forming a first phase change memory spacer 20 composed of a first phase change material that exhibits a first electrical conductance change during a SET operation and a RESET operation within the opening 16 and along a sidewall of the first dielectric spacer 18. In embodiments when no first dielectric spacer 18 is formed, the first phase change memory spacer 20 is formed along, and is in direct physical contact with, the sidewall of the ILD material layer 14 provided by opening 16.

As is known to those skilled in the art, a phase change material exhibits a change in electrical resistance (or inversely electrical conductance) depending on the phase change (from crystalline to amorphous or vice versa) of the phase change material.

When a phase change material exhibits an increase in electrical resistance (or inversely a decrease in electrical conductance) during a RESET operation, and a decrease in electrical resistance (or inversely an increase in electrical resistance) during a SET operation, such a phase change material can be referred to a 'regular' phase change material. Regular phase change materials are typically composed of a chalcogenide that contains an element from Group 16 (i.e., a chalcogen) of the Periodic Table of Elements and a more electropositive element. Examples of chalcogens that can be used as a regular phase change material include, but are not limited to, a GeSbTe alloy (GST), a SbTe alloy, or an InSe alloy. Other materials can also be used as the regular phase change material so long as the other material can retain separate amorphous and crystalline states and exhibits the above "regular' change in electrical resistance (or inversely electrical conductance).

When a phase change memory material exhibits a decrease in electrical resistance (or inversely an increase in electrical conductance) during a RESET operation, and an increase in electrical resistance (or inversely a decrease in electrical resistance) during a SET operation, such a phase change material can be referred to an 'inverse' phase change material. An example of an inverse phase change material that can be used in the present application includes $Cr_2Ge_2Te_6$ (CrGeT). Other materials can also be used as the inverse phase change material so long as the other material can retain separate amorphous and crystalline states and exhibits the above 'inverse' change in electrical resistance (or inversely electrical conductance).

Thus, and in one embodiment, the first phase change material that provides the first phase change spacer 20 is a regular phase change material as described above. In another embodiment, the first phase change material that provides the first phase change spacer 20 is an inverse phase change material as described above.

Notwithstanding the type 'regular' or 'inverse' phase change material employed as the first phase change material that provides the first phase change spacer 20, the first phase change memory spacer 20 may be formed by a deposition process such as, for example, CVD, PECVD or ALD, followed by performing a spacer etching, such as, for example, RIE. In some embodiments, the first phase change memory spacer 20 has a topmost surface that is coplanar with a topmost surface of the ILD material layer 14 and, if present, a topmost surface of the first dielectric spacer 18. The first phase change memory spacer 20 has a first width, as measured from a first outermost sidewall to a second outermost sidewall, opposite the first outermost sidewall. In one embodiment, the first width can be from 10 nm to 30 nm. The first phase change memory spacer 20 has a bottommost surface that is in direct physical contact with a portion of the topmost surface of the first electrode 12.

Figure 5:
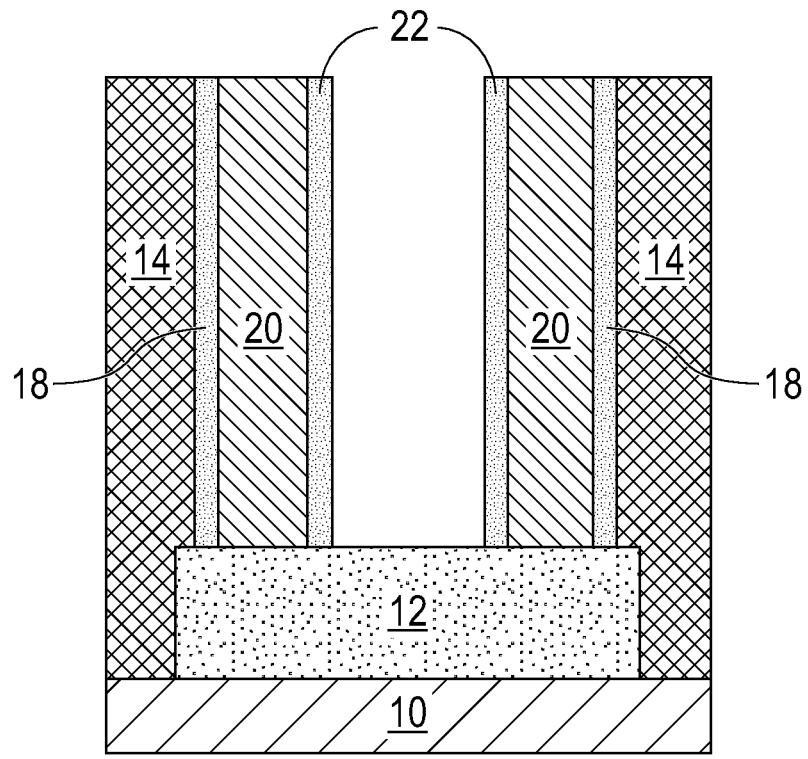
FIG. 5 is a cross sectional view of the exemplary memory structure of FIG. 4 after forming a second dielectric spacer within the opening and along a sidewall of the first phase change memory spacer.

Referring now to FIG. 5, there is illustrated the exemplary semiconductor structure of FIG. 4 after forming a second dielectric spacer 22 within the opening 16 and along a sidewall of the first phase change memory spacer 20. In some embodiments, the second dielectric spacer 22 may be omitted. The second dielectric spacer 22 has a bottommost surface that is in direct physical contact with a portion of the topmost surface of the first electrode 12. It should be noted that, although it is possible to omit the formation of the dielectric spacers, such dielectric spacers can be beneficial to prevent mixing of the various phase change material pillars (to be subsequently formed) of the phase change material-containing structure of the present application during SET and RESET operations.

When present, the second dielectric spacer 22 may include one of the spacer dielectric materials mentioned above for the first dielectric spacer 18. In one embodiment, the spacer dielectric material that provides the second dielectric spacer 22 is the same as the spacer dielectric material that provides the first dielectric spacer 18. In another embodiment, the spacer dielectric material that provides the second dielectric spacer 22 is different from the spacer dielectric material that provides the first dielectric spacer 18. The second dielectric spacer 22 may be formed utilizing the processes mentioned above for forming the first dielectric spacer 18. The second dielectric spacer 20 may have a width, as measured from a first outermost sidewall to a second outermost sidewall, opposite the first outermost sidewall, from 2 nm to 10 nm.

Figure 6:
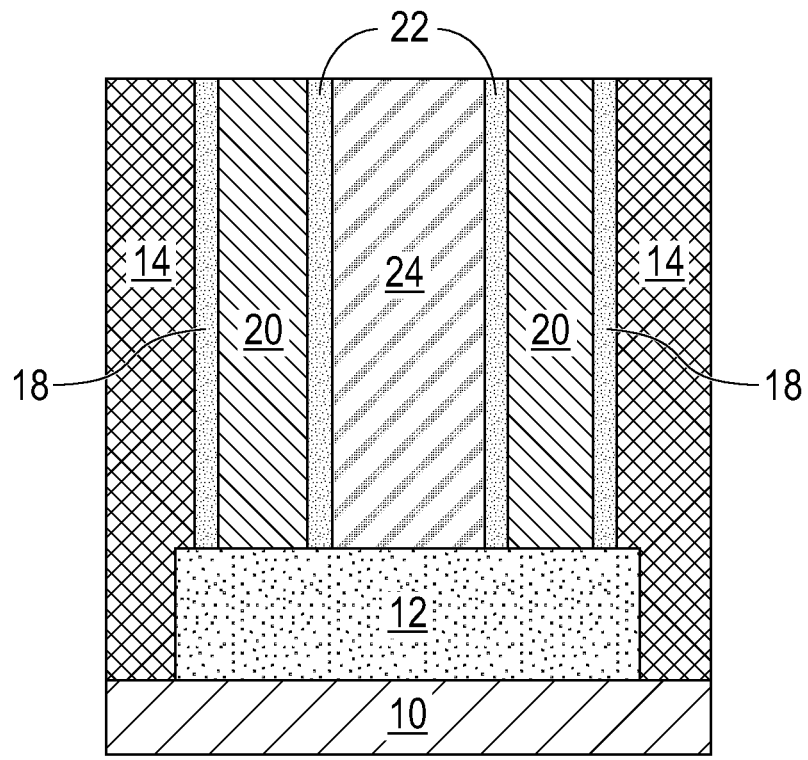
FIG. 6 is a cross sectional view of the exemplary memory structure of FIG. 5 after forming a second phase change memory spacer composed of a second phase change material that exhibits a second electrical conductance change, opposite from the first electrical conductance change, during the SET operation and the RESET operation in the opening and along a sidewall of the second dielectric spacer.

Referring now to FIG. 6, there is illustrated the exemplary memory structure of FIG. 5 after forming a second phase change memory spacer 24 composed of a second phase change material exhibiting a second electrical conductance change during a SET operation and a RESET operation, opposite from the first electrical conductance change, during the SET operation and RESET operation in the opening and along a sidewall of the second dielectric spacer 22. In the illustrated embodiment, the second phase change memory spacer 24 is spaced apart from the first phase change memory spacer 20 by the second dielectric spacer 22. When the second dielectric spacer 22 is omitted, the second phase change memory spacer 24 directly contacts a sidewall of the first phase change memory spacer 20. The second phase change memory spacer 24 has a bottommost surface that directly contacts the topmost surface of the first electrode 12.

The second phase change material that provides the second phase change memory spacer 24 may include a regular phase change material, as defined above, or an inverse phase change material, as also defined above, with the proviso that the second phase change material exhibits an opposite electrical conductance change during a SET operation and a RESET operation than the first phase change material that provides the first phase change memory spacer 20. In one embodiment, and when the first phase change material that provides the first phase change memory spacer 20 is an inverse phase change material, then the second phase change material that provides the second phase change memory spacer 24 is a regular phase change material. In another embodiment, and when the first phase change material that provides the first phase change memory spacer 20 is a regular phase change material, then the second phase change material that provides the second phase change memory spacer 24 is an inverse phase change material.

The second phase change memory spacer 24 may be formed by a deposition process such as, for example, CVD, PECVD or ALD, followed by performing a spacer etching, such as, for example, RIE. In some embodiments, the second phase change memory spacer 20 has a topmost surface that is coplanar with a topmost surface of the ILD material layer 14 and a topmost surface of the first phase change memory spacer 20, and if present, a topmost surface of the first and second dielectric spacers (18, 22). The second phase change memory spacer 24 has a second width, as measured from a first outermost sidewall to a second outermost sidewall, opposite the first outermost sidewall. The second width may be less than, equal to, or greater than the first width. In one embodiment, the second width can be from 6 nm to 30 nm. The second phase change memory spacer 24 has a bottommost surface that is in direct physical contact with a portion of the topmost surface of the first electrode 12, and is present in the center of the opening 16.

Figure 7:
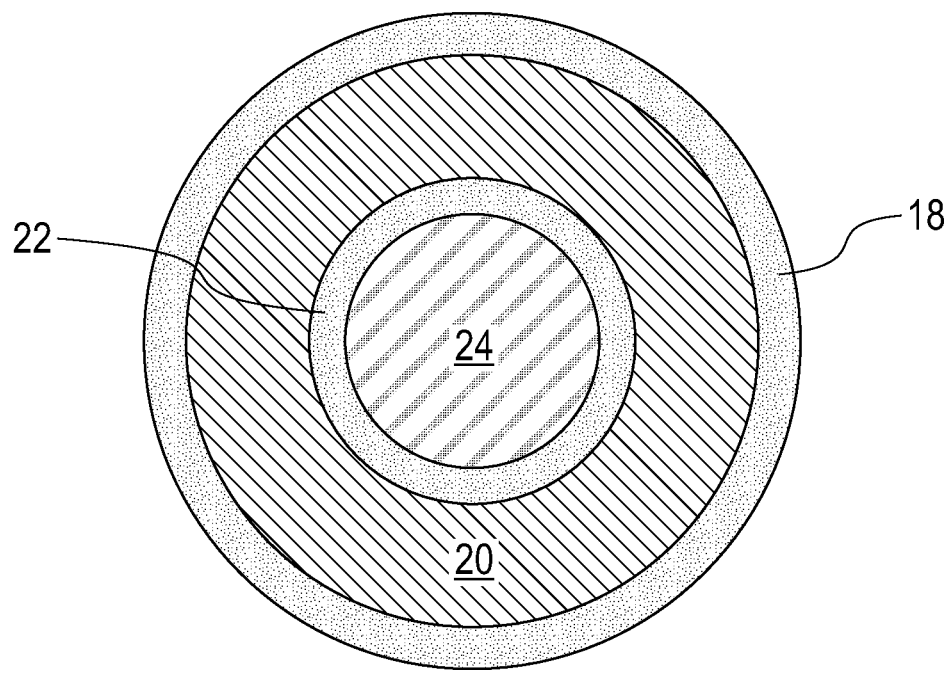
FIG. 7 is a top down view of the exemplary memory structure of FIG. 6 showing only the phase change memory area including the first dielectric spacer, the first phase change memory spacer, the second dielectric spacer, and the second phase change memory spacer in accordance with an embodiment of the present application.

Referring now to FIG. 7, there is illustrated the exemplary memory structure of FIG. 6 showing only the phase change memory area including the first dielectric spacer 18, the first phase change memory spacer 20, the second dielectric spacer 22, and the second phase change memory spacer 24 in accordance with an embodiment of the present application. The illustrated embodiment shows that the each of the first dielectric spacer 18, the first phase change memory spacer 20, the second dielectric spacer 22, and the second phase change memory spacer 24 is circular in shape (i.e., concentric), and that the second phase change memory spacer 24 serves as the core of the circular shaped phase change memory area. The first dielectric spacer 18, the first phase change memory spacer 20, the second dielectric spacer 22, and the second phase change memory spacer 24 in the phase change memory area may have other shapes, such as, for example, rectangular, square or oval, besides circular.

Figure 8:
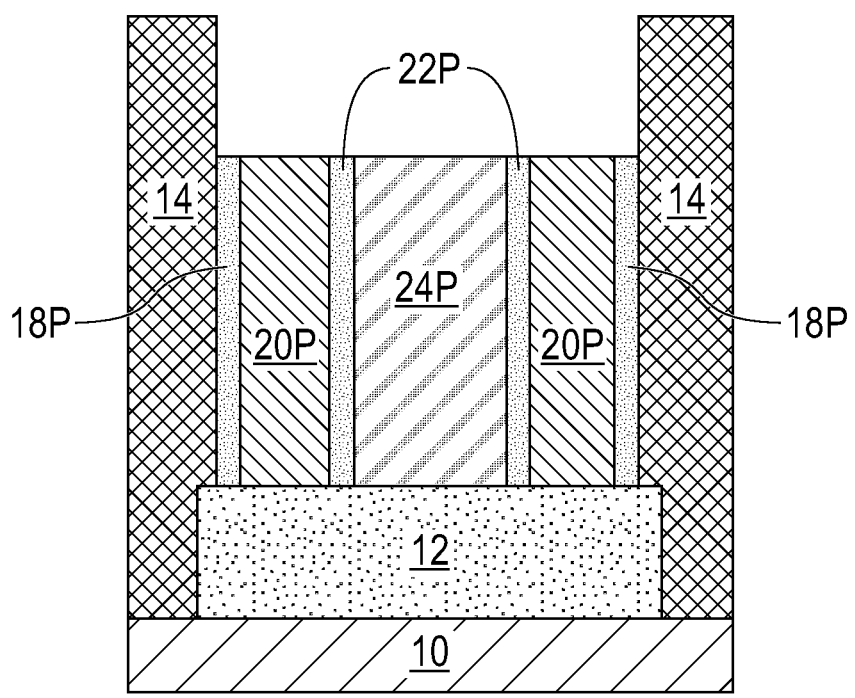
FIG. 8 is a cross sectional view of the exemplary memory structure of FIG. 6 after recessing the first dielectric spacer, the first phase change memory spacer, the second dielectric spacer, and the second phase change memory spacer.

Referring now to FIG. 8, there is illustrated the exemplary memory structure of FIG. 6 after recessing the first dielectric spacer 18, the first phase change memory spacer 20, the second dielectric spacer 22, and the second phase change memory spacer 24. The recessing may be performed utilizing a recess etching process that is selective in recessing the dielectric spacers and the phase change memory spacers. The recessed dielectric spacers and recessed phase change memory spacers have a topmost surface that is below the topmost surface of the ILD material layer 14, and coplanar with each other.

The remaining portion of the first dielectric spacer 18 after recessing may be referred to as a first dielectric pillar 18P, the remaining portion of the first phase change material spacer 20 after recessing may be referred to as a first phase change memory pillar 20P, the remaining portion of the second dielectric spacer 22 after recessing may be referred to as a second dielectric pillar 22P, and the remaining portion of the second phase change material spacer 24 after recessing may be referred to as a recessed second phase change memory pillar 24P. Collectively, the first phase change memory pillar 20P, and the second phase change memory pillar 24P, and, if present, the first and second dielectric pillars (18P, 22P) may be referred to a phase change memory material-containing structure having a gradually changing conductance.

Figure 9:
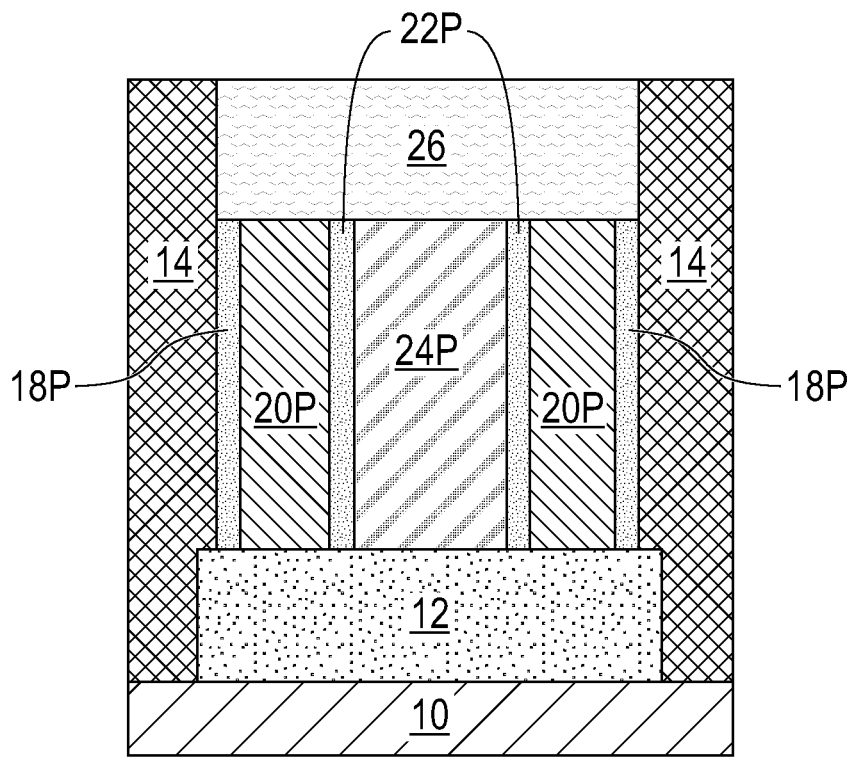
FIG. 9 is a cross sectional view of the exemplary memory structure of FIG. 8 after forming a second electrode in contact with each of the recessed first dielectric spacer, the recessed first phase change memory spacer, the recessed second dielectric spacer, and the recessed second phase change memory spacer.

Referring now to FIG. 9, there is illustrated the exemplary memory structure of FIG. 8 after forming a second electrode 26 in contact with each of the recessed first dielectric spacer (i.e., the first dielectric pillar 18P), the recessed first phase change memory spacer (i.e., the first phase change memory pillar 20P), the recessed second dielectric spacer (i.e., the second dielectric pillar 22P), and the recessed second phase change memory spacer (i.e., the second phase change memory pillar 24P). The second electrode 26 has an outermost sidewall that contacts a physically exposed upper sidewall portion of the ILD material layer 14 in opening 16.

The second electrode 26 (i.e., top electrode) may be composed of one of the conductive metals or metal nitrides mentioned above for the first electrode 12. The second electrode 26 may be formed by utilizing one of the deposition processes mentioned above for forming the first electrode 12. In some embodiments, a planarization process such as, for example, chemical mechanical polishing (CMP) and/or grinding, may follow the deposition of the conductive metal or metal nitride that provides the second electrode 26. Thus, and in some embodiments, the second electrode 26 may have a topmost surface that is coplanar with a topmost surface of the ILD material layer 14.

Collectively, the first and second electrodes (12, 26) and the phase change memory material-containing structure (containing the phase change material pillars and, if present, the dielectric pillars) provide a PCM cell of the present application. The phase change material pillars (20P, and 24P) have a same height; the widths of the phase change material pillars may be the same or different. In this embodiment, the PCM cell contains multiple concentric phase change memory pillars (20P, 24P) that have different phase change material compositions and different phase switching characteristics, as described above.

Figure 10A:
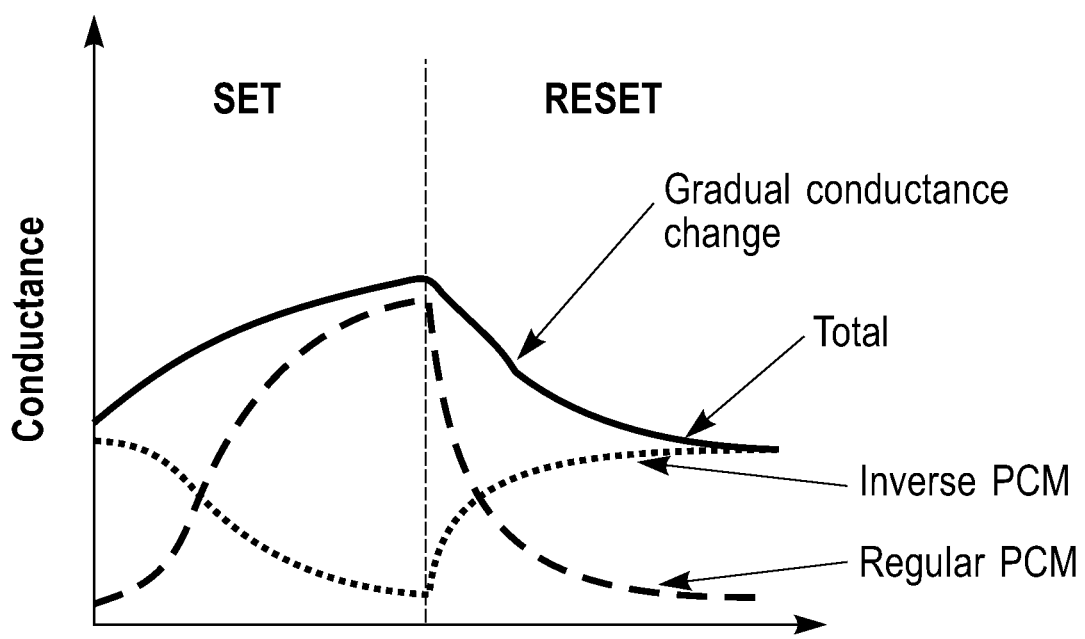
FIG. 10A is a schematic diagram illustrating the SET and RESET operations of a phase change memory cell in accordance with an embodiment of the present application.

Referring now to FIG. 10A, there is provided a schematic diagram illustrating the SET and RESET operations in accordance with an embodiment of the present application for a phase change memory (PCM) cell that includes a phase change material pillar composed of GST (i.e., a regular phase change material (PCM)) and a phase change material pillar that is composed of CrGeT (i.e., an inverse phase change material (PCM)); similar results will be observed with other combinations of regular and inverse phase change materials.

The SET and RESET operations can be performed by applying one or more electrical pulses to the phase change materials. The electrical pulses for the SET and RESET operations can have different amplitude of pulses and/or duration of pulses. During the SET operation, the phase change materials change from an amorphous state to a crystalline state. For a regular PCM material, the electrical resistance decreases, and the electrical conductance increases during the SET operation. For an inverse PCM material, its electrical resistance increases, and its electrical conductance decreases during the SET operation. The electrical resistance (or electrical conductance) change during the SET operation is typically gradual. During the RESET operation, the phase change materials change from a crystalline state to an amorphous state. For a regular PCM material, its electrical resistance increases, and its electrical conductance decreases during the RESET operation. For an inverse PCM material, its electrical resistance decreases, and its electrical conductance increases during the RESET operation. As discussed earlier, the electrical resistance (or electrical conductance) change during the RESET operation is typically abrupt. As is shown in FIG. 10A, collectively, the regular PCM material and the inverse PCM material provide a PCM cell that has a gradual change in electrical conductance during both SET and RESET operations. That is, the abrupt electrical conductance drop of the regular PCM material is compensated by the abrupt electrical conductance increase of the inverse PCM material. Thus, the electrical conductance change of PCM cell of the present application (comprising a regular PCM material and an inverse PCM material) becomes more symmetric during the SET and RESET operations than that of each PCM material alone. In some embodiments, the PCM cells of the present application can be used in analog (or neuromorphic) computing to represent the weights in machine learning models. The gradual change of electrical conductance in both the SET and RESET operations is beneficial in those applications.

Figure 10B:
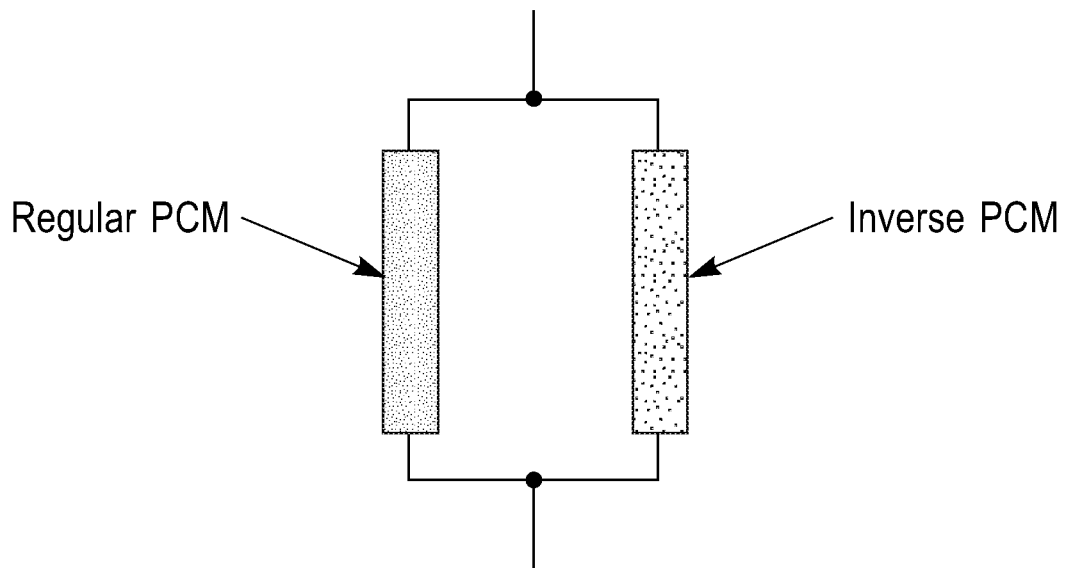
FIG. 10B is a diagram illustrating the equivalent circuit of a phase change memory cell of the present application.

Referring now to FIG. 10B, there is provided a diagram illustrating the equivalent circuit of a PCM cell of the present application. As is shown, the regular PCM material is in parallel with the inverse PCM material.

Figure 11:
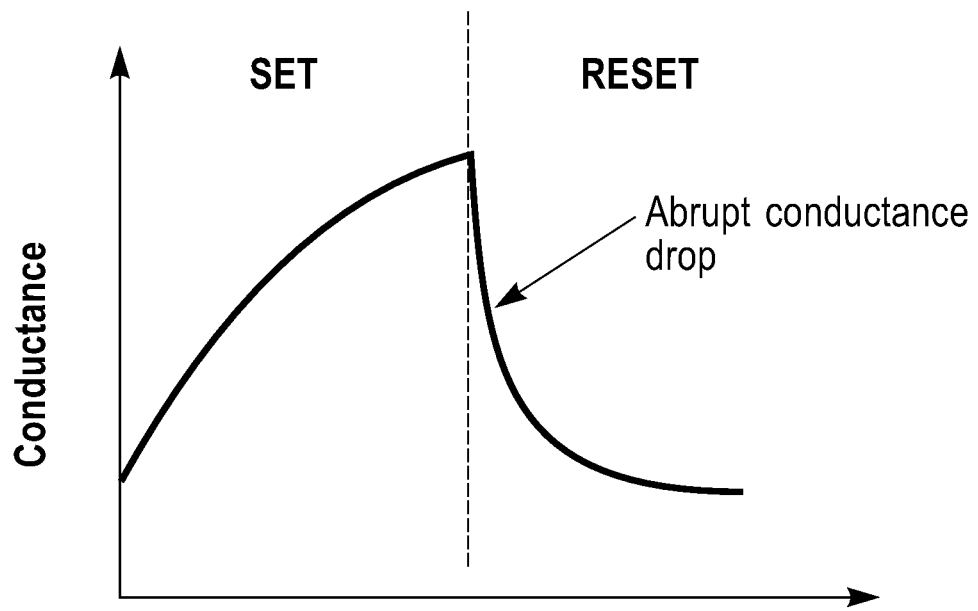
FIG. 11 is a schematic diagram illustrating the SET and RESET Operations in accordance with the prior art.

Referring now to FIG. 11, there is provided a schematic diagram illustrating the SET and RESET operations in accordance with a prior art phase change memory (PCM) cell. The prior art PCM cell includes only a phase change material pillar composed of GST (i.e., a regular PCM material). As is shown in FIG. 11, and during the SET operation the regular PCM material has a gradual increase in electrical conductance by changing from amorphous phase to crystalline phase, and during the RESET operation, the regular PCM material has an abrupt decrease in electrical conductance by changing from crystalline phase to amorphous phase. As a result, the electrical conductance change during the SET and RESET operations as shown in FIG. 11 is asymmetric. The asymmetry of the prior art PCM cell causes issues in analog computing or in neuromorphic computing.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
    a first electrode located on a surface of a semiconductor substrate;
    a phase change material-containing structure exhibiting a gradual conductance change located on the first electrode, wherein the phase change material-containing structure comprises a first phase change material pillar composed of a first phase change material that exhibits a first electrical conductance change during a SET operation and a RESET operation laterally adjacent to a second phase change material pillar composed of a second phase change material that exhibits a second electrical conductance change, which is opposite the first electrical conductance change, during the SET operation and the RESET operation, wherein a first sidewall of the first phase change material pillar is in direct physical contact with a sidewall of the second phase change material pillar; and
    a second electrode located on a surface of the phase change material-containing structure.

2. The memory structure of claim 1, wherein the first phase change material pillar and the second phase change material pillar are in parallel with each other.

3. The memory structure of claim 1, further comprising an interlevel dielectric material layer laterally surrounding the phase change material-containing structure and located on the semiconductor substrate.

4. The memory structure of claim 3, wherein the interlevel dielectric material layer is in direct physical contact with a second sidewall of the first phase change material pillar, wherein the second sidewall is opposite the first sidewall of the first phase change material pillar.

5. The memory structure of claim 1, wherein the first phase change material is a regular phase change material, and the second phase change material is an inverse phase change material.

6. The memory structure of claim 5, wherein the first phase change material comprises GeSbTe alloy (GST), a SbTe alloy, or an InSe alloy, and the second phase change material comprises $Cr_2Ge_2Te_6$ (CrGeT).

7. The memory structure of claim 1, wherein the first phase change material is an inverse phase change material, and the second phase change material is a regular phase change material.

8. The memory structure of claim 7, wherein the first phase change material comprises $Cr_2Ge_2Te_6$ (CrGeT) and the second phase change material comprises GeSbTe alloy (GST), a SbTe alloy, or an InSe alloy.

9. The memory structure of claim 1, wherein the first and second phase change material pillars are concentric and have a same height.

10. A memory structure comprising:
a first electrode located on a surface of a semiconductor substrate;
a phase change material-containing structure exhibiting a gradual conductance change located on the first electrode, wherein the phase change material-containing structure comprises a first phase change material pillar composed of a first phase change material that exhibits a first electrical conductance change during a SET operation and a RESET operation laterally adjacent to a second phase change material pillar composed of a second phase change material that exhibits a second electrical conductance change, which is opposite the first electrical conductance change, during the SET operation and the RESET operation;
a second electrode located on a surface of the phase change material-containing structure; and
an interlevel dielectric material layer laterally surrounding the phase change material-containing structure and located on the semiconductor substrate, wherein the interlevel dielectric material layer is spaced apart from the first phase change material pillar by a dielectric pillar.

11. The memory structure of claim 10, wherein the first phase change material pillar is spaced apart from the second phase change material pillar by another dielectric pillar.

* * * * *